United States Patent
Zhou et al.

(10) Patent No.: US 9,933,645 B2
(45) Date of Patent: Apr. 3, 2018

(54) ARRAY SUBSTRATE, DISPLAY PANEL, DISPLAY DEVICE AND MANUFACTURING METHOD THEREOF

(71) Applicants: Shanghai Tianma Micro-Electronics Co., Ltd., Shanghai (CN); Tianma Micro-Electronics Co., Ltd., Shenzhen (CN)

(72) Inventors: Xingyao Zhou, Shanghai (CN); Qijun Yao, Shanghai (CN); Jun Ma, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 22 days.

(21) Appl. No.: 14/957,583

(22) Filed: Dec. 2, 2015

(65) Prior Publication Data

US 2016/0357048 A1 Dec. 8, 2016

(30) Foreign Application Priority Data

Jun. 4, 2015 (CN) .......................... 2015 1 0306302

(51) Int. Cl.
*G02F 1/1333* (2006.01)
*G06F 3/041* (2006.01)
(Continued)

(52) U.S. Cl.
CPC ........ *G02F 1/13338* (2013.01); *G02F 1/1368* (2013.01); *G02F 1/13439* (2013.01);
(Continued)

(58) Field of Classification Search
CPC ...... G06F 3/044; G06F 3/0412; G06F 3/0416; G06F 3/041; G06F 3/047; G06F 2203/04103; G06F 2203/04111; G06F 2203/04112; G02F 1/13; G02F 1/13338; G02F 1/136; G02F 1/1368; G02F 1/136286; G02F 1/133345; G02F 1/1343;
(Continued)

(56) References Cited

U.S. PATENT DOCUMENTS 8,553,013 B2* 10/2013 Kim ...................... G06F 3/0412
178/18.06
2016/0349559 A1* 12/2016 Woo .................... G02F 1/13338

FOREIGN PATENT DOCUMENTS

CN 101577248 A 11/2009
CN 102043295 A 5/2011
(Continued)

*Primary Examiner* — Thoi Duong
(74) *Attorney, Agent, or Firm* — Faegre Baker Daniels LLP (57) ABSTRACT

An array substrate, a display panel, a display device and a manufacturing method thereof. The array substrate includes: a substrate; a plurality of thin film transistors spaced apart from each other and disposed in an array on the substrate; a first passivation layer on the plurality of thin film transistors; and a plurality of touch signal lines and a pixel electrode layer on the first passivation layer, where the pixel electrode layer includes a plurality of pixel electrodes spaced apart from each other and disposed in an array, and is disposed in the same layer as the touch signal lines and electrically insulated from the touch signal lines.

18 Claims, 9 Drawing Sheets

(51) Int. Cl.
*G02F 1/1335* (2006.01)
*G02F 1/1343* (2006.01)
*G02F 1/1362* (2006.01)
*G02F 1/1368* (2006.01)
*H01L 27/12* (2006.01)
*G06F 3/044* (2006.01)

(52) U.S. Cl.
CPC .. *G02F 1/133345* (2013.01); *G02F 1/133514* (2013.01); *G02F 1/134309* (2013.01); *G02F 1/136227* (2013.01); *G06F 3/044* (2013.01); *G06F 3/0412* (2013.01); *H01L 27/124* (2013.01); *H01L 27/1259* (2013.01); *G02F 2001/134318* (2013.01); *G02F 2001/136218* (2013.01); *G06F 2203/04103* (2013.01)

(58) Field of Classification Search
CPC ............. G02F 1/134309; G02F 1/1335; G02F 1/133514; G02F 1/134336; G02F 1/134363; G02F 1/1362; G02F 1/136227; G02F 1/13306; G02F 1/1333; G02F 1/155; G02F 2001/136295; G02F 2001/134318; G02F 2001/13629; G02F 2001/134372; G02F 2201/124; H01L 27/3262; H01L 27/3265; H01L 27/3276; G09G 2300/0426; G09G 2300/08; G09G 2300/0439; G09G 3/3677; G09G 3/3688; G09G 3/3648; G09G 3/3655; G09G 3/2085; G09G 2310/0202
USPC ... 349/12, 43, 106, 138, 139, 141, 143, 187, 349/152
See application file for complete search history.

(56) References Cited

FOREIGN PATENT DOCUMENTS

| | | |
|---|---|---|
| CN | 102109713 A | 6/2011 |
| CN | 102129142 A | 7/2011 |
| CN | 102193230 B | 9/2011 |
| CN | 102681277 A | 9/2012 |
| CN | 202631908 U | 12/2012 |
| CN | 103176302 A | 6/2013 |
| CN | 104020909 A | 9/2014 |
| CN | 104022127 A | 9/2014 |
| CN | 104022128 A | 9/2014 |
| CN | 104062817 A | 9/2014 |
| CN | 203910800 U | 10/2014 |
| CN | 104238222 A | 12/2014 |
| CN | 104657024 A | 5/2015 |

* cited by examiner

ARRAY SUBSTRATE, DISPLAY PANEL, DISPLAY DEVICE AND MANUFACTURING METHOD THEREOF

CROSS-REFERENCE TO RELATED APPLICATION

This application claims priority to Chinese Application No. 201510306302.6, filed Jun. 4, 2015, which is herein incorporated by reference in its entirety.

TECHNICAL FIELD

The present disclosure relates to the field of display technologies and, in particular, to an array substrate, display panel, display device, and manufacturing method thereof.

BACKGROUND

With the development of electronic technologies, functions of display devices are not limited to receiving and subsequently displaying video signals. Nowadays, the display device has been integrated with a touch sensing function, so that a control instruction can be input into the display device according to a touch operation performed by an operator on the display device.

Currently, depending on their structures, touch panels include an add-on type touch panel, an on-cell touch panel, and an in-cell touch panel. In the in-cell touch panel, touch electrodes are embedded inside a liquid crystal display panel to reduce the overall thickness of the touch panel and greatly decrease the cost of manufacturing the touch panel, therefore, the in-cell touch panel is very popular among touch panel manufacturers.

However, layouts and designs of functional film layers in an array substrate of the existing in-cell touch panel are complicated and require many manufacturing processes, thereby leading to a relatively high manufacturing cost, which limits the widespread use thereof.

SUMMARY

This disclosure provides an array substrate, a display panel and a manufacturing method thereof, to reduce the manufacturing processes for the in-cell touch panels, optimize the layouts of film layers in the in-cell touch panel, and reduce costs of the in-cell touch panel.

In a first example, embodiments of the disclosure provide a method for manufacturing an array substrate, including:
sequentially forming a plurality of thin film transistors spaced apart from each other and disposed in an array, a first passivation layer, a plurality of touch signal lines, and a pixel electrode layer on a substrate;
where the pixel electrode layer includes a plurality of pixel electrodes spaced apart from each other and disposed in an array, and disposed in the same layer as the touch signal lines and electrically insulated from the touch signal lines.

In a second example, embodiments of the disclosure provide an array substrate, including:
a substrate;
a plurality of thin film transistors spaced apart from each other and disposed in an array on the substrate;
a first passivation layer on the plurality of thin film transistors; and
a plurality of touch signal lines and a pixel electrode layer on the first passivation layer;
where the pixel electrode layer includes a plurality of pixel electrodes spaced apart from each other and disposed in an array, and disposed in the same layer as the touch signal lines and electrically insulated from the touch signal lines.

In a third example, embodiments of the disclosure provide a display panel, including:
an array substrate according to embodiments described above,
a color filter substrate opposite to the array substrate; and
a display medium layer between the array substrate and the color filter substrate.

In a fourth example, embodiments of the disclosure provide a display device, including:
a driving chip, and a display panel described in the above embodiments, where the driving chip is configured for display driving and touch sensing driving.

With the disclosure, a plurality of thin film transistors spaced apart from each other and disposed in an array, a first passivation layer, a plurality of touch signal lines, and a pixel electrode layer are sequentially formed on a substrate; where the pixel electrode layer includes a plurality of pixel electrodes spaced apart from each other and disposed in an array, and disposed in the same layer as the touch signal lines and electrically insulated from the touch signal lines, so that the number of masks in the process of in-cell touch panels is decreased and the layout of the film layers is optimized, thereby decreasing the cost.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be described below in more detail in conjunction with the accompanying drawings and embodiments. It can be understood that, the embodiments described here are intended to explain the disclosure, but not to limit the disclosure. Also, for ease of description, the drawings only show parts relevant to the disclosure, and not all of the disclosure.

Figure 1:
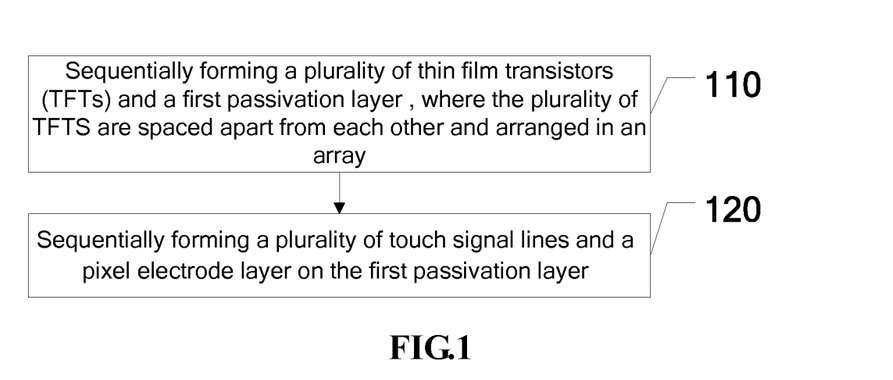
FIG. 1 is a schematic flow chart of a manufacturing method for an array substrate, according to embodiments of the disclosure.

FIG. 1 is a schematic flow chart of a manufacturing method for an array substrate, according to embodiments of the disclosure, and the manufacturing method includes the following Steps 110 and 120.

Step 110 includes sequentially forming a plurality of thin film transistors (TFTs) and a first passivation layer on a substrate, where the plurality of TFTs are spaced apart from each other and disposed in an array.

The substrate can be made of glass or transparent plastic and so on, each of the plurality of TFTs is used as a switch element in one of the pixels in the array substrate, and the first passivation layer, which is made of insulation material, is configured to electrically insulate the TFTs from individual conductive film layers above the TFTs.

Step 120 includes sequentially forming a plurality of touch signal lines and a pixel electrode layer on the first passivation layer.

The pixel electrode layer includes a plurality of pixel electrodes spaced apart from each other and disposed in an array, and is disposed in the same layer as the touch signal lines and electrically insulated from the touch signal lines.

As such, in embodiments of the disclosure, the plurality of touch signal lines and the pixel electrode layer are sequentially formed on the first passivation layer, and the pixel electrode layer is disposed in the same layer as the touch signal lines and electrically insulated from the touch signal lines, so that the number of film layers in the array substrate is decreased, thereby reducing the thickness of the array substrate.

Figure 2:
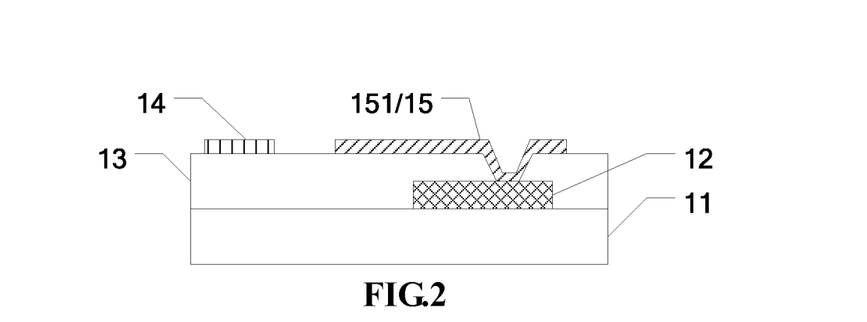
FIG. 2 is a schematic view showing a cross-sectional structure of an array substrate, according to embodiments of the disclosure.

The disclosure also provides an array substrate. FIG. 2 is a schematic view showing the cross-sectional structure of an array substrate, according to embodiments of the disclosure. As shown in FIG. 2, the substrate array includes: a substrate 11, a plurality of TFTs 12 (only one of which is shown for example) spaced apart from each other and disposed in an array on the substrate 11, a first passivation layer 13 on the plurality of TFTs 12, and a plurality of touch signal lines 14 and a pixel electrode layer 15 on the first passivation layer 13, where the pixel electrode layer 15 includes a plurality of pixel electrodes 151 spaced apart from each other and disposed in an array, and disposed in the same layer as the touch signal lines 14 and electrically insulated from the touch signal lines 14.

It should be noted that only partial structures and the relevant manufacturing steps involved in the embodiments of the disclosure, instead of all the structures and manufacturing steps of the array substrate, are shown for ease of description; as long as the plurality of TFTs 12 are spaced apart from each other and disposed in an array, the first passivation layer 13, the plurality of touch signal lines 14, and the pixel electrode layer 15 are sequentially formed on the substrate, and the pixel electrode layer 15 is disposed in the same layer as the touch signal lines 14 and electrically insulated from the touch signal lines 14. In other embodiments, a plurality of manufacturing methods for the array substrate are possible, and the individual film layers of the array substrate may be disposed in various manners. For example, the common electrode blocks for touch sensing in the array substrate may be formed in a different manufacturing step, and may be disposed at different positions. Embodiments will be described in detail as follows.

Figure 3:
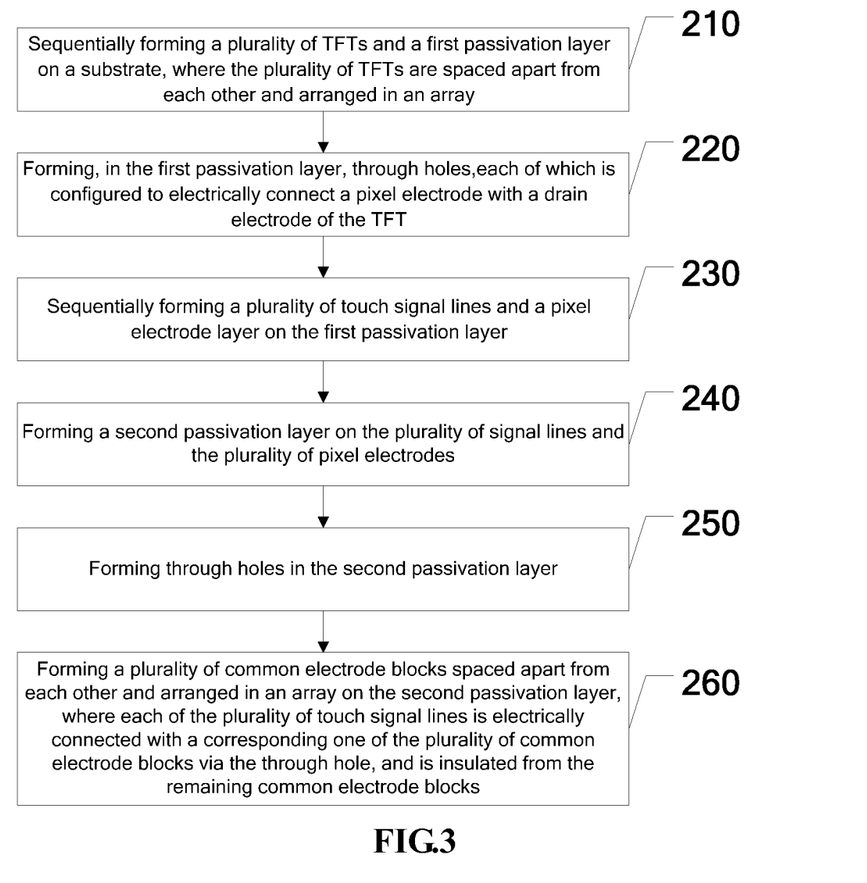
FIG. 3 is a schematic flow chart of another manufacturing method for an array substrate, according to embodiments of the disclosure.

FIG. 3 is a schematic flow chart of another manufacturing method for an array substrate, according to embodiments of the disclosure. FIGS. 4A to 4F are schematic views of cross-sectional structures corresponding to the respective steps in FIG. 3. As shown in FIG. 3 and FIGS. 4A to 4F, a manufacturing method for an array substrate includes Steps 210 to 260 below.

Step 210 includes sequentially forming a plurality of TFTs and a first passivation layer on a substrate, where the plurality of TFTs are spaced apart from each other and disposed in an array.

Figure 4A:
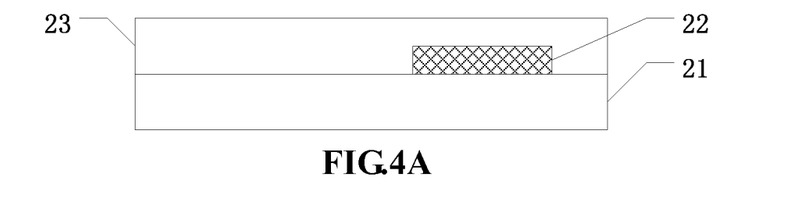
FIGS. 4A to 4F are schematic views of cross-sectional structures corresponding to the respective steps in FIG. 3, according to embodiments of the disclosure.

As shown in FIG. 4A, a plurality of TFTs 22 (only one of which is shown for example), spaced apart from each other and disposed in an array, and a first passivation layer 23 are sequentially formed on a substrate 21.

Step 220 includes forming, in the first passivation layer, first through holes, each of which is configured to electrically connect a pixel electrode with a drain electrode of the TFT.

Figure 4B:
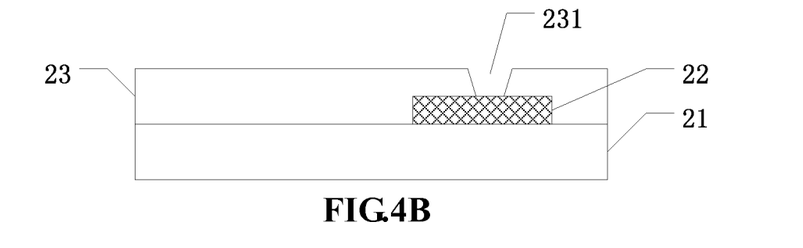

As shown in FIG. 4B, a first through hole 231 is formed in the first passivation layer 23 to expose a source electrode or a drain electrode of the TFT 22, so that a pixel electrode formed subsequently is allowed to be electrically connected with the source electrode or the drain electrode of the TFT 22.

Step 230 includes sequentially forming a plurality of touch signal lines and a pixel electrode layer on the first passivation layer.

The pixel electrode layer includes a plurality of pixel electrodes spaced apart from each other and disposed in an array, and disposed in the same layer as the touch signal lines and electrically insulated from the touch signal lines.

Figure 4C:
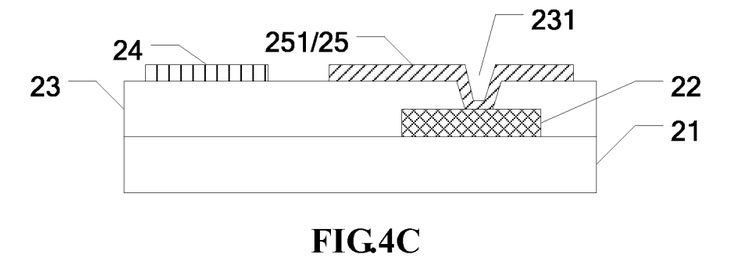

As shown in FIG. 4C, a plurality of touch signal lines 24 and a pixel electrode layer 25 are sequentially formed on the first passivation layer 23, and the pixel electrode layer 25 includes a plurality of pixel electrodes 251 spaced apart from each other and disposed in an array, and disposed in the same layer as the touch signal lines 24 and electrically insulated from the touch signal lines 24. Each of the pixel electrodes 251 is connected with a drain electrode of the TFT 22 via the first through hole 231.

Step 240 includes forming a second passivation layer on the plurality of touch signal lines and the plurality of pixel electrodes.

Figure 4D:
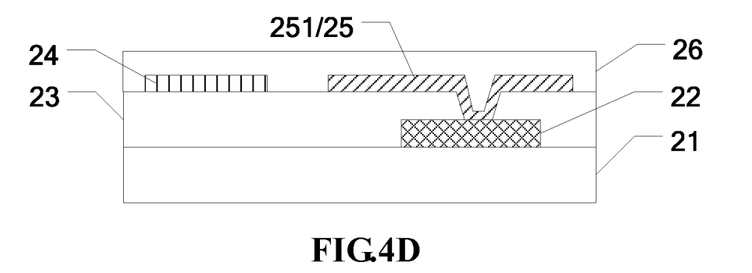

As shown in FIG. 4D, a second passivation layer 26 is formed on the touch signal lines 24 and the pixel electrodes 251.

Step 250 includes forming second through holes in the second passivation layer.

Figure 4E:
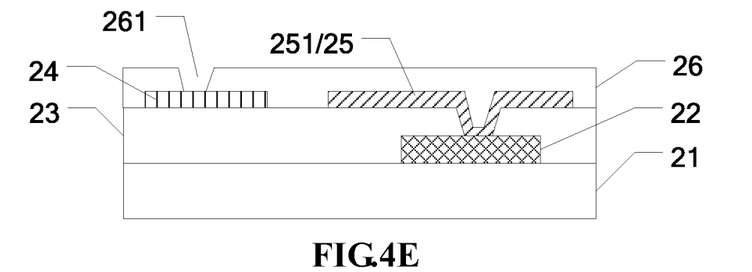

As shown in FIG. 4E, a second through hole 261 is formed in a second passivation layer 26.

The touch signal line 24 is exposed by the second through hole 261, to allow a common electrode layer formed subsequently to be electrically connected with the touch signal line 24.

Step 260 includes forming a plurality of common electrode blocks spaced apart from each other and disposed in an array on the second passivation layer, where each of the plurality of touch signal lines is electrically connected with a corresponding one of the plurality of common electrode blocks via the second through hole and is insulated from the remaining common electrode blocks.

Figure 4F:
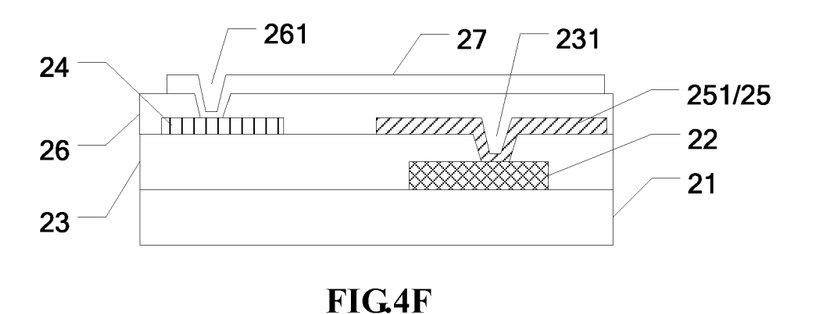

As shown in FIG. 4F, a plurality of common electrode blocks 27 (only one of which is shown for example), spaced apart from each other and disposed in an array, are formed on the second passivation layer 26, so that each of the plurality of touch signal lines 24 is electrically connected with a corresponding one of the plurality of common electrode blocks 27 via the second through hole 261 and is insulated from the remaining common electrode blocks 27. As such, the connection of each of the touch signal lines 24 with a corresponding one of the common electrode blocks 27 allows for determining a position of a user touch. Herein, each common electrode block 27 corresponds to one or more pixels, and a touch sensing resolution depends on the number of the common electrode blocks 27.

Based on embodiments mentioned above, when forming the plurality of TFTs 22 spaced apart from each other and disposed in an array on the substrate 21, the method further includes: forming a plurality of data lines and a plurality of scan lines on the substrate 21, where orthogonal projections of the touch signal lines 24 onto the substrate 21 are located within orthogonal projections of the data lines or the scan lines onto the substrate 21, so that the aperture rate of the pixels of the array substrate is not affected by the touch signal lines 24.

The thickness of the first passivation layer 23 is in a range from 3000 Å to 35000 Å, so that the parasitic capacitance generated between the touch signal lines 24 and the data lines as well as between the touch signal lines 24 and the scan lines can be reduced, thereby improving the touch sensing performance.

Further, the thickness of the second passivation layer 26 is in a range from 1000 Å to 5000 Å, so that the storage capacitance generated between the common electrode block 27 and the pixel electrode 251 can be increased, and the electrical field between the common electrode block 27 and the pixel electrode 251 can be strengthened, thereby enhancing the ability for driving liquid crystal molecules, improving the display performance and reducing power consumption.

Optionally, at least one of the first and second passivation layers 23 and 26 is made of at least one of SiNx and SiOx.

Corresponding to the manufacturing method for an array substrate shown in FIG. 3, embodiments of the disclosure also provide an array substrate. As shown in FIG. 4F, which is a schematic view of a cross-sectional structure of the array substrate, the array substrate includes: a substrate 21; a plurality of TFTs 22 spaced apart from each other and disposed in an array on the substrate 21; a first passivation layer 23 on the plurality of TFTs 22; a plurality of touch signal lines 24 and a pixel electrode layer 25 on the first passivation layer 23, where pixel electrode layer 25 includes a plurality of pixel electrodes 251 spaced apart from each other and disposed in an array; a second passivation layer 26 on the plurality of touch signal lines 24 and the pixel electrodes 251; and a plurality of common electrode blocks 27 spaced apart from each other and disposed in an array on the second passivation layer 26. The pixel electrode layer 25 is disposed in the same layer as the touch signal lines 24 and electrically insulated from the touch signal lines 24. First through holes 231 are formed in the first passivation layer 23 so that each of the pixel electrodes 251 is allowed to be electrically connected with a drain electrode of a corresponding one of the TFTs 22. Second through holes 261 are formed in the second passivation layer 26, so that each of the touch signal lines 24 is electrically connected with a corresponding one of the common electrode blocks 27 via the second through hole 261, and is insulated from the remaining common electrode blocks 27.

In the array substrate and the manufacturing method thereof, according to embodiments of the disclosure, the common electrode blocks 27 are operable as touch electrodes, so that the total thickness of the array substrate is reduced, an additional etching process for the touch electrodes is omitted, and a separate mask for the touch electrodes is eliminated, thereby reducing costs and the required masks and increasing the productivity. Moreover, the plurality of touch signal lines 24 and the pixel electrode layer 25 are sequentially formed on the first passivation layer 23, the pixel electrode layer 25 is disposed in the same layer as the touch signal lines 24 and electrically insulated from the touch signal lines 24, the first passivation layer 23 is disposed between the plurality of touch signal lines 24 and the plurality of TFTs 22, and the second passivation layer 26 is disposed between the pixel electrode layer 25 and the plurality of common electrode blocks 27, therefore, by adjusting the thicknesses of first passivation layer 23 and/or the second passivation layer 26, the distance between the touch signal lines 24 and the TFTs 22 and/or the distance between the pixel electrode layer 25 and the common electrode blocks 27 may be varied. Therefore, the distance between the touch signal lines 24 and the TFTs 22 is independent of the distance between the pixel electrode layer 25 and the common electrode blocks 27. A decrease in the thickness of the second passivation layer 26 increases the storage capacitance between the pixel electrode layer 25 and the common electrode blocks 27, and an increase in the thickness of the first passivation layer 23 reduces the coupled capacitance between the touch signal lines 24 and the data lines connected with the TFTs 22.

Figure 5:
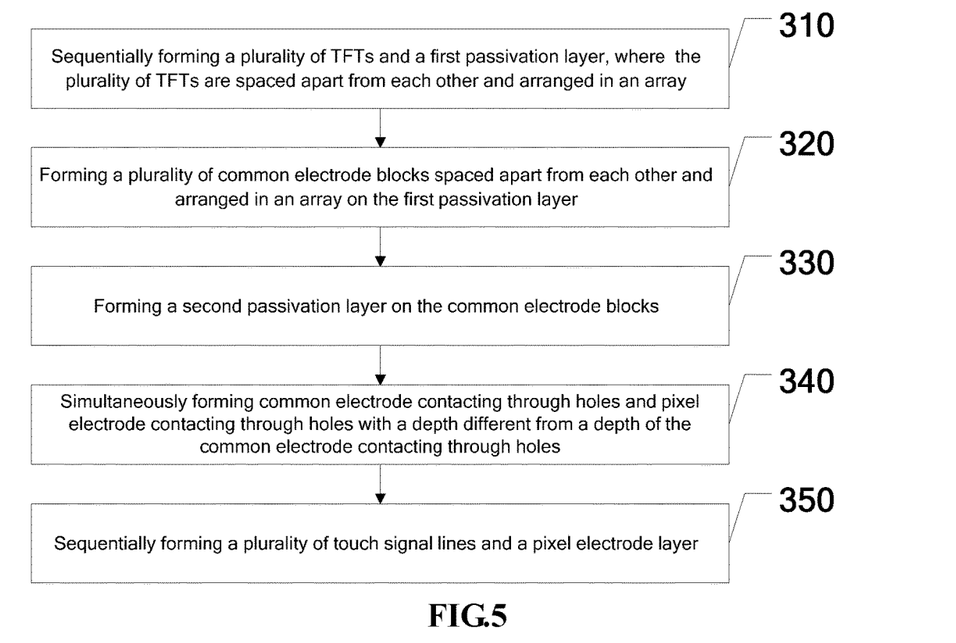
FIG. 5 is a schematic flow chart of another manufacturing method for an array substrate, according to embodiments of the disclosure.

FIG. 5 is a schematic flow chart of another manufacturing method for an array substrate, according to embodiments of the disclosure. FIGS. 6A to 6E are schematic views showing the cross-sectional structures corresponding to the respective steps in FIG. 5. As shown in FIGS. 5 and 6A to 6E, the manufacturing method for an array substrate includes Steps 310 to 350 below.

Step 310 includes sequentially forming a plurality of TFTs and a first passivation layer on a substrate, where the plurality of TFTs are spaced apart from each other and disposed in an array.

Figure 6A:
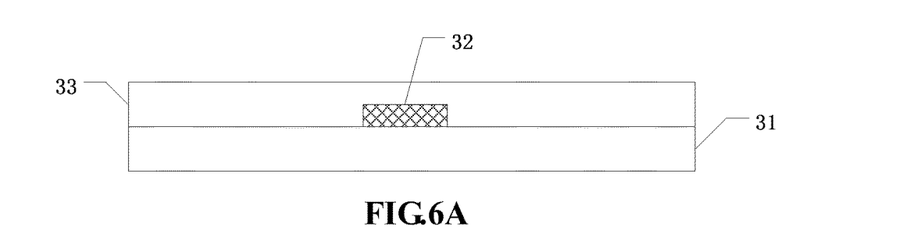
FIGS. 6A to 6E are schematic views showing the cross-sectional structures corresponding to the respective steps in FIG. 5, according to embodiments of the disclosure.

As shown in FIG. 6A, a plurality of TFTs 32 spaced apart from each other and disposed in an array and a first passivation layer 33 are sequentially formed on a substrate 31.

Step 320 includes forming a plurality of common electrode blocks spaced apart from each other and disposed in an array on the first passivation layer.

Figure 6B:
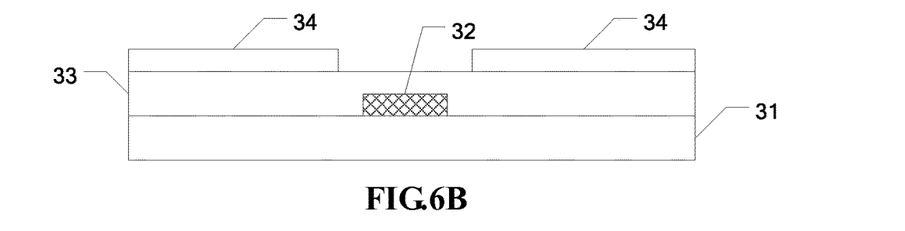

As shown in FIG. 6B, a plurality of common electrode blocks 34 spaced apart from each other and disposed in an array are formed on the first passivation layer 33. The common electrode blocks 34 are operable as touch electrodes, that is, when the array substrate operates in a display state, the common electrode blocks 34 are configured to provide a common voltage; and when the array substrate operates in a touch sensing state, the common electrode blocks 34 function as touch electrodes.

Step 330 includes forming a second passivation layer on the common electrode blocks 34.

Figure 6C:
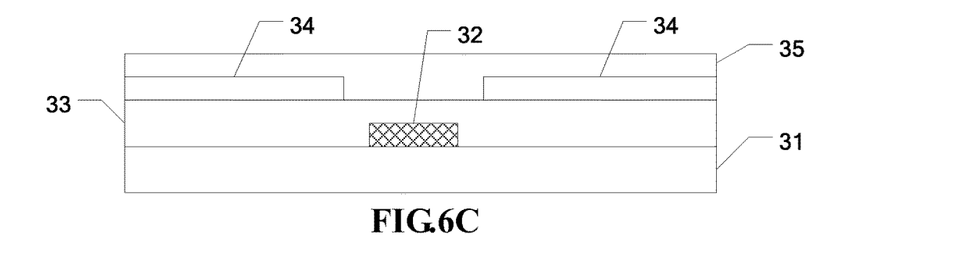

As shown in FIG. 6C, a second passivation layer 35 is formed on the common electrode blocks 34.

Step 340 includes simultaneously forming third through holes and fourth through holes with a depth different from a depth of the common electrode contacting through holes.

Figure 6D:
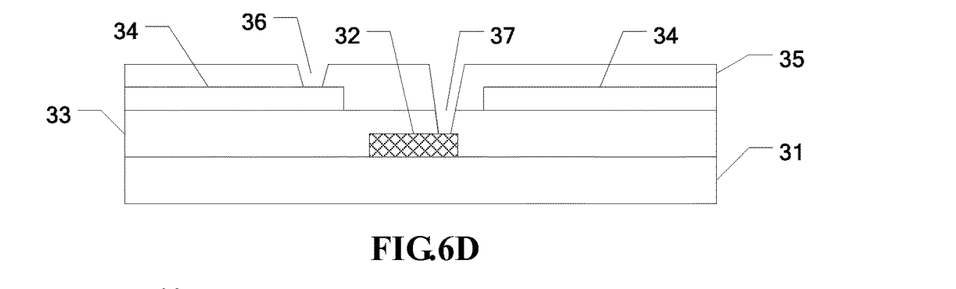

As shown in FIG. 6D, a third through hole 36 and a fourth through hole 37 with different depths are formed simultaneously. For example, the third through hole 36 and the fourth through hole 37 with different depths are one-time formed as per etching selectivity. Since the common electrode blocks 34 are located between the first passivation layer 33 and the second passivation layer 35, the depth of the third through hole 36 is less than that of the fourth through hole 37. For the etching process, exposure patterns for the third through holes 36 and the fourth through holes 37 are formed using a single-exposure mask process, and are used for the simultaneous etching to form the third through holes 36 and the fourth through holes 37. The common electrode block 34 is generally made of transparent conductive material such as tin indium oxide. During the etching process, when the second passivation layer 35 is etched through, the third through hole 36 is formed; subsequently, the material of the common electrode block 34 below the second passivation layer 35 can be etched only at a slow rate by the etching gas, but the etching gas continues to etch the first passivation layer 33 to eventually form the fourth through hole 37 and the etching process is terminated at this time.

Step 350 includes sequentially forming a plurality of touch signal lines and a pixel electrode layer.

Figure 6E:
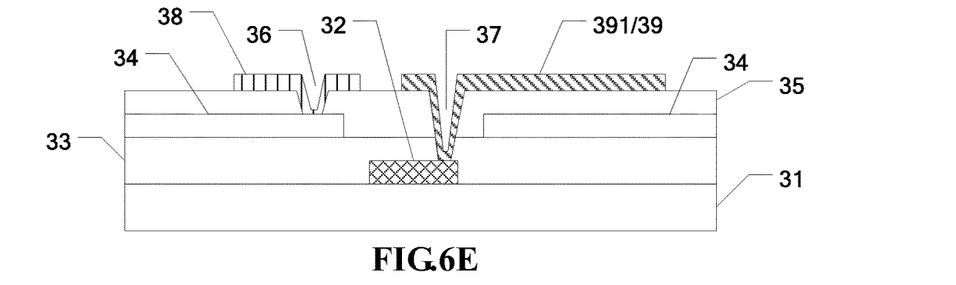

As shown in FIG. 6E, a plurality of touch signal lines 38 and a pixel electrode layer 39 are sequentially formed on the second passivation layer 35. The pixel electrode layer 39 includes a plurality of pixel electrodes 391 spaced apart from each other and disposed in an array, and is disposed in the same layer as the touch signal lines 38 and electrically insulated from the touch signal lines 38; further, the third through hole 36 extends through the second passivation layer 35, so that each touch signal line 38 can be electrically connected with a corresponding one of the common electrode blocks through the third through hole 36 and be insulated from the remaining common electrode blocks; while the fourth through hole 37 extends through the first passivation layer 33 and the second passivation layer 35 to allow for an electrical connection of each pixel electrode 391 with a drain electrode or source electrode of the corresponding TFT 32.

Based on embodiments mentioned above, when forming the plurality of TFTs 32 spaced apart from each other and disposed in an array on the substrate 31, the method further includes: forming a plurality of data lines and a plurality of scan lines on the substrate 31, where orthogonal projections of the touch signal lines 38 onto the substrate 31 are located within orthogonal projections of the data lines or the scan lines onto the substrate 31, so that the aperture rate of the pixels of the array substrate is not affected by the touch signal lines 38.

The thickness of the first passivation layer 33 is in a range from 3000 Å to 35000 Å, so that the parasitic capacitance generated between the common electrode blocks 34 and the data lines as well as between the common electrode blocks 34 and the scan lines can be reduced, thereby decreasing the power consumption and increasing the touch sensing performance.

Further, the thickness of the second passivation layer 35 is in a range from 1000 Å to 5000 Å, so that the storage capacitance generated between the common electrode block 34 and the pixel electrode 391 can be increased, and the electrical field between the common electrode block 34 and the pixel electrode 391 can be strengthened, thereby enhancing the ability for driving liquid crystal molecules, improving the display performance and reducing power consumption.

Optionally, at least one of the first and second passivation layers 33 and 35 is made of at least one of SiNx and SiOx.

Corresponding to the manufacturing method for an array substrate shown in FIG. 5, embodiments of the disclosure provide another array substrate. As shown in FIG. 6E which is a schematic view of a cross-sectional structure of the array substrate, the array substrate includes: a substrate 31; a plurality of TFTs 32 spaced apart from each other and disposed in an array on the substrate 31; a first passivation layer 33 on the TFTs 32; a plurality of common electrode blocks 34 spaced apart from each other and disposed in an array on the first passivation layer 33; a second passivation layer 35 on the common electrode blocks 34, and a plurality of touch signal lines 38 and a pixel electrode layer 39 on the second passivation layer 35. The pixel electrode layer 39 includes a plurality of pixel electrodes 391 spaced apart from each other and disposed in an array, and disposed in the same layer as the touch signal lines 38 and electrically insulated from the touch signal lines 38; further, the third through hole 36 extends through the second passivation layer 35, so that each touch signal line 38 can be electrically connected with a corresponding one of the common electrode blocks 34 and be insulated from the remaining common electrode blocks 34; and the fourth through hole 37 extends through the first passivation layer 33 and the second passivation layer 35 to allow for an electrical connection of each pixel electrode 391 with a drain electrode of the corresponding TFT 32. The third through hole 36 and the fourth through hole 37 have different depths and are formed simultaneously in the same one process.

In the array substrate and the manufacturing method thereof, according to embodiments of the disclosure, the pixel electrode layer 39 and the touch signal lines 38 are located in the same layer, the pixel electrode layer 39 is located above the common electrode blocks 34, and the third through hole and the fourth through hole with different depths are formed simultaneously, to allow each touch signal line 38 to be electrically connected with a corresponding one of the common electrode blocks 34 and to be insulated from the remaining common electrode blocks 34, and allow each pixel electrode to be electrically connected with a drain electrode or source electrode of the corresponding TFT 32, thereby reducing the manufacturing process and decreasing costs.

Figure 7:
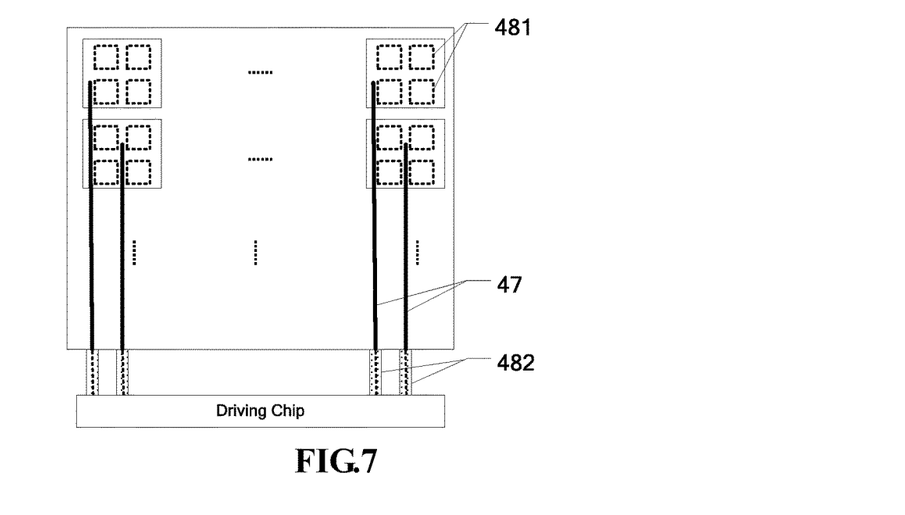
FIG. 7 is a schematic plan view of a prepared pixel electrode layer, according to embodiments of the disclosure.

Based on embodiments mentioned above, the pixel electrode layer may further include: a plurality of protection lines 482 insulated from each other, where each of the plurality of protection lines 482 is configured to overlap an output terminal of one of the plurality of touch signal lines. FIG. 7 is a schematic plan view of a prepared pixel electrode layer, according to embodiments of the disclosure. As shown in FIG. 7, the pixel electrode layer includes a plurality of pixel electrodes 481 spaced apart from each other and disposed in an array and a plurality of protection lines 482 insulated from each other, and each of the plurality of protection lines 482 covers an output terminal of one of the plurality of touch signal lines 47. In forming the pixel electrode layer on the first passivation layer, the plurality of pixel electrodes 481 spaced apart from each other and disposed in an array and the plurality of protection lines 482 insulated from each other are formed. As such, the plurality of protection lines 482 and the plurality of pixel electrodes 481 may be formed in the same one process. The reason for such arrangement is that: since the pixel electrode layer may be formed after the plurality of touch signal lines 47, the plurality of pixel electrodes 481 spaced apart from each other and disposed in an array and the plurality of protection lines 482 insulated from each other can be fabricated simultaneously in the process for forming the pixel electrode layer. Herein, each of the protection lines 482 overlaps an output terminal of one of the touch signal lines 47, and the output terminal of each touch signal line 47 is connected with a driving chip for the transmission of a touch signal. In the succeeding processes for preparing the display panel, a color filter substrate, which has a size less than that of the array substrate, is arranged on the array substrate, thus output terminals of the touch signal lines 47 in the array substrate that are connected with the driving chip are exposed to the environment, and hence are likely scraped in the succeeding manufacturing, testing and conveying processes. Therefore, the plurality of touch signal lines 47 are formed before the pixel electrode layer is formed, the pixel electrode layer includes a plurality of pixel electrodes 481 spaced apart from each other and disposed in an array and a plurality of protection lines 482 insulated from each other, and each of the plurality of protection lines 482 overlaps an output terminal of one of the plurality of touch signal lines 47, so that the touch signal lines 47 are protected against scrapping in the succeeding manufacturing, testing, and conveying processes.

In embodiments mentioned above, the TFT of the array substrate can have a bottom gate structure in an implementation, and accordingly, forming a plurality of TFTs spaced apart from each other and disposed in an array on the substrate includes:

sequentially forming a gate electrode, a gate electrode insulating layer, a semiconductor layer, a source electrode and a drain electrode of each TFT on the substrate.

Figure 8:
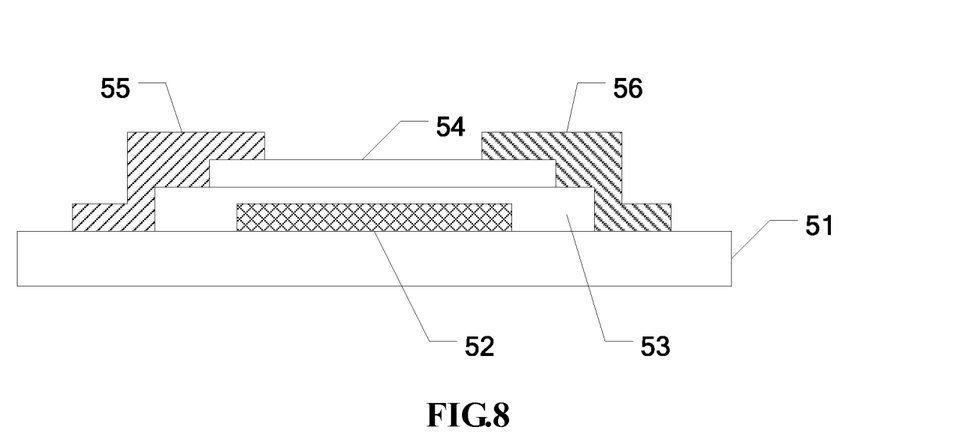
FIG. 8 is a schematic view showing a cross-sectional structure of a thin film transistor of an array substrate, according to embodiments of the disclosure.

FIG. 8 is a schematic view showing the cross-sectional structure of a TFT of an array substrate, according to embodiments of the disclosure. As shown in FIG. 8, the TFT of the array substrate has a bottom gate structure, and sequentially includes, from bottom to top, a gate electrode 52, a gate insulating layer 53, a semiconductor layer 54, a source electrode 55 and a drain electrode 56 on the substrate 51.

In other embodiments, the TFT of the array substrate can have a top gate structure, and accordingly, forming a plurality of TFTs spaced apart from each other and disposed in an array on the substrate includes:

sequentially forming a semiconductor layer, a source electrode, a drain electrode, a gate insulating layer and a gate electrode of each TFT on the substrate.

Figure 9:
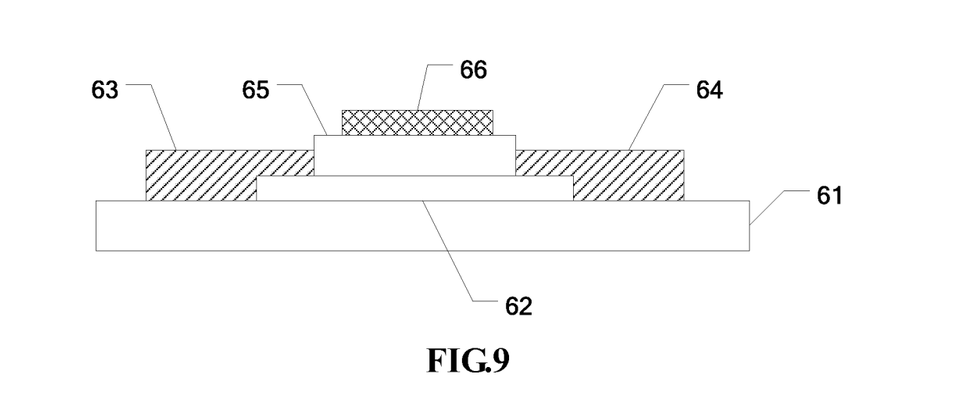
FIG. 9 is a schematic view showing another cross-sectional structure of a thin film transistor of an array substrate, according to embodiments of the disclosure.

FIG. 9 is a schematic view showing the cross-sectional structure of another TFT of an array substrate, according to embodiments of the disclosure. As shown in FIG. 9, the TFT of the array substrate has a top gate structure, and includes, from bottom to top, a semiconductor layer 62, a source electrode 63, a drain electrode 64, a gate insulating layer 65 and a gate electrode 66 on the substrate 61.

The arrangement of the plurality of common electrode blocks spaced apart from each other and disposed in an array is described below.

Figure 10:
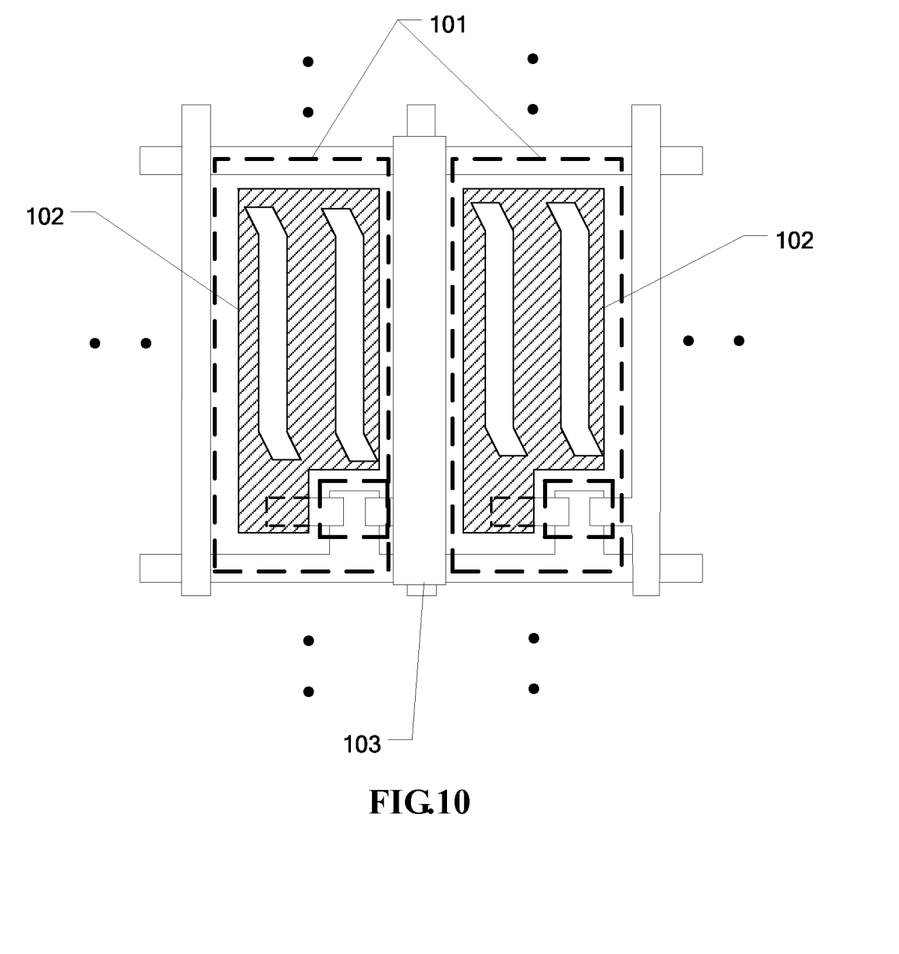
FIG. 10 is a schematic view showing an arrangement of common electrode blocks, according to embodiments of the disclosure.

FIG. 10 is a schematic view showing an arrangement of common electrode blocks, according to embodiments of the disclosure. As shown in FIG. 10, the orthogonal projection of a gap between adjacent two common electrode blocks 101 onto the substrate is located in the orthogonal projection of a gap between adjacent two pixel electrodes 102 onto the substrate. In some embodiments, the orthogonal projection of the touch signal line 103 onto the substrate is arranged to cover the gap between the adjacent two common electrode blocks 101. As such, the light-leak phenomenon caused by a voltage difference between the data line located at the gap between adjacent two pixel electrodes and the pixel electrodes can be avoided.

Figure 11:
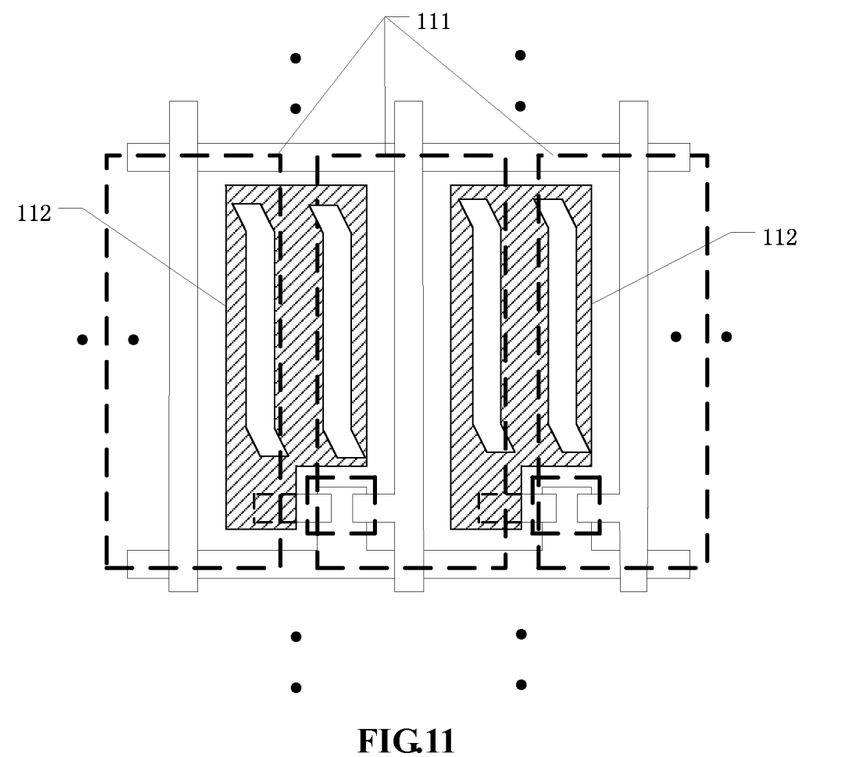
FIG. 11 is a schematic view showing another arrangement of common electrode blocks, according to embodiments of the disclosure.

FIG. 11 is a schematic view showing another arrangement of common electrode blocks, according to embodiments of the disclosure. As shown in FIG. 11, in the array substrate, the orthogonal projection of a gap between adjacent two common electrode blocks 111 onto the substrate is located in the orthogonal projection of the corresponding pixel electrode 112 onto the substrate. As such, the light-like phenomenon can be avoided because the data line located between adjacent two pixel electrodes 112 is shielded by the above common electrode block 111.

Figure 12:
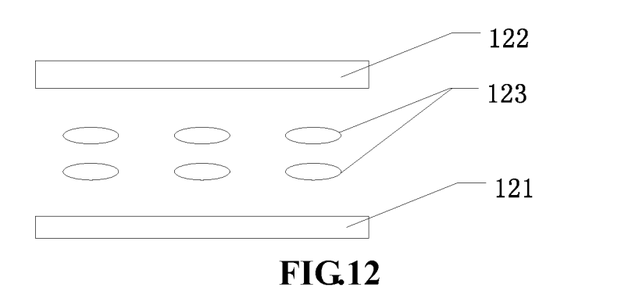
FIG. 12 is a schematic view showing the structure of a display panel, according to embodiments of the disclosure.

Embodiments of the disclosure also provide a display panel. FIG. 12 is a schematic view showing the structure of a display panel, according to embodiments of the disclosure. As shown in FIG. 12, the display panel includes an array substrate 121, a color filter substrate 122 opposite to the array substrate 121, and a display medium layer 123 between the array substrate 121 and the color filter substrate 122. The array substrate 121 may be one described in the above embodiments. Since the display panel adopts the array substrate described in the above embodiments, the display panel has the same advantage as that of the array substrate.

Figure 13:
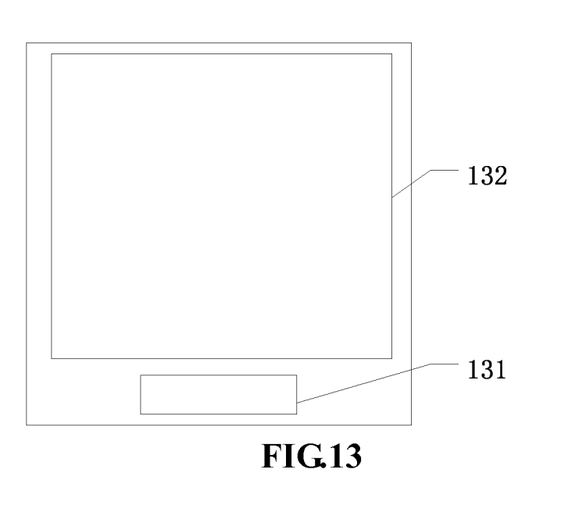
FIG. 13 is a schematic view showing the structure of a display device, according to embodiments of the disclosure.

Embodiments of the disclosure also provide a display device. FIG. 13 is a schematic view showing the structure of a display device, according to embodiments of the disclosure. As shown in FIG. 13, the display device includes: a driving chip 131 and a display panel 132, and further includes other parts for supporting the normal operations of the display panel. The display panel may be one described in the above embodiments. The driving chip is configured for display driving and touch sensing driving. The display device mentioned above can be one of a mobile phone, a tablet computer, electronic paper, and an electronic photo frame, for example.

According to the disclosure, since the display device adopts the display panel mentioned above, the display device has the same advantage as that of the display panel mentioned above.

Embodiments of the disclosure and the technical principles used therein have been described as above. It should be appreciated that the disclosure is not limited to the particular embodiments described herein, and any apparent alterations, modification and substitutions can be made without departing from the scope of the disclosure. Accordingly, while the disclosure is described in detail through the above embodiments, the disclosure is not merely limited to the above embodiments and can further include other additional embodiments without departing from the concept of the disclosure.

Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. A method for manufacturing an array substrate, comprising:
   sequentially forming a plurality of thin film transistors spaced apart from each other and disposed in an array, a first passivation layer, a plurality of touch signal lines and a pixel electrode layer on a substrate;
   wherein the pixel electrode layer comprises a plurality of pixel electrodes spaced apart from each other and disposed in an array, and is disposed in the same layer as the touch signal lines and electrically insulated from the touch signal lines; and
   wherein the pixel electrode layer further comprises:
   a plurality of protection lines insulated from each other, wherein each of the plurality of protection lines is disposed on an output terminal of a respective one of the plurality of touch signal lines to cover and protect the respective one of the plurality of touch signal lines against being scraped, and the output terminal is connected to a driving chip.

2. The method of claim 1, after forming the first passivation layer and before forming the plurality of touch signal lines, further comprising:
   forming first through holes in the first passivation layer, each of which is configured to electrically connect each of the plurality of pixel electrodes with a drain electrode of a corresponding one of the plurality of thin film transistors;
   after forming the pixel electrode layer, further comprising:
   forming a second passivation layer on the touch signal lines and the pixel electrodes;
   forming second through holes in the second passivation layer; and
   forming a plurality of common electrode blocks spaced apart from each other and disposed in an array on the second passivation layer, wherein each of the plurality of touch signal lines is electrically connected with a corresponding one of the plurality of common electrode blocks via one of the second through holes in the second passivation layer, and is insulated from the remaining common electrode blocks.

3. The method of claim 2 wherein a thickness of the first passivation layer ranges from 3000 Å to 35000 Å.

4. The method of claim 2 wherein a thickness of the second passivation layer ranges from 1000 Å to 5000 Å.

5. The method of claim 2, wherein an orthogonal projection of a gap between adjacent two common electrode blocks onto the substrate is located in an orthogonal projection of a gap between adjacent two pixel electrodes onto the substrate.

6. The method of claim 2, wherein an orthogonal projection of a gap between adjacent two common electrode blocks onto the substrate is located in an orthogonal projection of one of the pixel electrodes onto the substrate.

7. The method of claim 1, after forming the first passivation layer and before forming the plurality of touch signal lines, further comprising:
   forming a plurality of common electrode blocks spaced apart from each other and disposed in an array on the first passivation layer;
   forming a second passivation layer on the plurality of common electrode blocks; and
   simultaneously forming third through holes extending through the second passivation layer and fourth through holes extending through both the first and the second passivation layers;
   wherein, each of the touch signal lines is electrically connected with a corresponding one of the common electrode blocks through one of the third through holes, and is insulated from the remaining common electrode blocks; while each of the pixel electrodes is electrically connected with a drain electrode of a corresponding one of the thin film transistors through one of the fourth through holes.

8. The method of claim 7, wherein an orthogonal projection of a gap between adjacent two common electrode blocks onto the substrate is located in an orthogonal projection of a gap between adjacent two pixel electrodes onto the substrate.

9. The method of claim 7, wherein an orthogonal projection of a gap between adjacent two common electrode blocks onto the substrate is located in an orthogonal projection of one of the pixel electrodes onto the substrate.

10. The method of claim 1, wherein when forming the plurality of thin film transistors spaced apart from each other and disposed in an array on the substrate, the method further comprises forming a plurality of data lines and a plurality of scan lines on the substrate, wherein orthogonal projections of the touch signal lines onto the substrate are located in orthogonal projections of the data lines or the scan lines onto the substrate.

11. An array substrate, comprising:
    a substrate;
    a plurality of thin film transistors spaced apart from each other and disposed in an array on the substrate;
    a first passivation layer on the plurality of thin film transistors; and
    a plurality of touch signal lines and a pixel electrode layer on the first passivation layer;
    wherein the pixel electrode layer comprises a plurality of pixel electrodes spaced apart from each other and disposed in an array, and is disposed in the same layer as the touch signal lines and electrically insulated from the touch signal lines; and
    wherein the pixel electrode layer further comprises:
    a plurality of protection lines insulated from each other, wherein each of the plurality of protection lines is disposed on an output terminal of a respective one of the plurality of touch signal lines to cover and protect the respective one of the plurality of touch signal lines against being scraped, and the output terminal is connected to a driving chip.

12. The array substrate of claim 11, further comprising
    a second passivation layer on the touch signal lines and the pixel electrodes; and
    a plurality of common electrode blocks spaced apart from each other and disposed in an array on the second passivation layer;

wherein each of the pixel electrodes is electrically connected with a drain electrode of a corresponding on of the thin film transistors via a first through hole in the first passivation layer;

each of the plurality of touch signal lines is electrically connected with a corresponding one of the plurality of common electrode blocks via a second through hole in the second passivation layer, and is insulated from the remaining common electrode blocks.

13. The array substrate of claim 11, further comprising a plurality of common electrode blocks spaced apart from each other and disposed in an array on the first passivation layer; and a second passivation layer between the common electrode blocks and the touch signal lines as well as the pixel electrodes;

wherein each of the pixel electrodes is electrically connected with a drain electrode of a corresponding one of the thin film transistors via a forth through hole extending through the first passivation layer and the second passivation layer;

each of the plurality of touch signal lines is electrically connected with a corresponding one of the plurality of common electrode blocks via a third through hole in the second passivation layer, and is insulated from the remaining common electrode blocks;

the fourth through hole is formed simultaneously with the third through hole.

14. The array substrate of claim 13, wherein a thickness of the first passivation layer ranges from 3000 Å to 35000 Å.

15. The array substrate of claim 13, wherein a thickness of the second passivation layer ranges from 1000 Å to 5000 Å.

16. The array substrate of claim 13, wherein an orthogonal projection of a gap between adjacent two common electrode blocks onto the substrate is located in an orthogonal projection of a gap between adjacent two pixel electrodes onto the substrate.

17. The array substrate of claim 13, wherein an orthogonal projection of a gap between adjacent two common electrode blocks onto the substrate is located in an orthogonal projection of a corresponding one of the pixel electrodes onto the substrate.

18. A display panel, comprising:
an array substrate, comprising:
a substrate;
a plurality of thin film transistors spaced apart from each other and disposed in an array on the substrate;
a first passivation layer on the plurality of thin film transistors; and
a plurality of touch signal lines and a pixel electrode layer on the first passivation layer;
wherein the pixel electrode layer comprises a plurality of pixel electrodes spaced apart from each other and disposed in an array, and is disposed in the same layer as the touch signal lines and electrically insulated from the touch signal lines, and the pixel electrode layer further comprises: a plurality of protection lines insulated from each other, wherein each of the plurality of protection lines is disposed on an output terminal of a respective one of the plurality of touch signal lines to cover and protect the respective one of the plurality of touch signal lines against being scraped, and the output terminal is connected to a driving chip;
a color filter substrate opposite to the array substrate; and
a display medium layer between the array substrate and the color filter substrate.

* * * * *